(12) United States Patent
Kim et al.

(10) Patent No.: US 8,319,537 B2
(45) Date of Patent: Nov. 27, 2012

(54) MODULATION PROFILE GENERATOR AND SPREAD SPECTRUM CLOCK GENERATOR INCLUDING THE SAME

(75) Inventors: Chul Woo Kim, Seoul (KR); Se Wook Hwang, Seoul (KR); Min Young Song, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 146 days.

(21) Appl. No.: 13/034,002

(22) Filed: Feb. 24, 2011

(65) Prior Publication Data

US 2012/0001658 A1 Jan. 5, 2012

(30) Foreign Application Priority Data

Jun. 30, 2010 (KR) .......................... 10-2010-0062981

(51) Int. Cl.
*H03K 3/017* (2006.01)

(52) U.S. Cl. .......................... 327/172; 327/167; 327/176
(58) Field of Classification Search .......... 327/165–167, 327/172, 176, 299; 375/130, 132, 134, 355
See application file for complete search history.

(56) References Cited

U.S. PATENT DOCUMENTS 7,362,191 B2 * 4/2008 Chen et al. ..................... 331/78
* cited by examiner

*Primary Examiner* — An Luu
(74) *Attorney, Agent, or Firm* — Pearne & Gordon LLP

(57) ABSTRACT

There is provided a modulation profile generator and spread spectrum clock generator including the modulation profile generator. The modulation profile generator includes an input signal generator that generates an input signal; a function calculator that outputs a function calculation result in the form of a square root graph by using the input signal as an input of a function; and a profile generator that generates a non-linear modulation profile based on the function calculation result. As a result, it is possible to effectively reduce electromagnetic interference.

19 Claims, 8 Drawing Sheets

MODULATION PROFILE | FREQUENCY SPECTRUM (a)

(b)

(c)

(c)

(e)

(f)

MODULATION PROFILE GENERATOR AND SPREAD SPECTRUM CLOCK GENERATOR INCLUDING THE SAME

CROSS-REFERENCE TO RELATED APPLICATION

This application claims the benefit of Korean Patent Application No. 10-2010-0062981 filed on Jun. 30, 2010, the entire disclosures of which are incorporated herein by reference.

FIELD OF THE INVENTION

The present disclosure relates to a spread clock generator for reducing electromagnetic interference and a modulation profile generator used therein.

BACKGROUND OF THE INVENTION

As a processing rate of a semiconductor increases due to rapid technological advance in this area of technology, a rate of a clock signal and an operating frequency of a memory device used in an electronic apparatus are continuously on the increase. Accordingly, due to electromagnetic interference (EMI) generated by the electronic apparatus, a problem of causing malfunction of peripheral circuits may increase.

A spread spectrum clock generator (hereinafter, referred to as "SSCG") is a circuit useful to reduce EMI. The SSCG can be implemented in various ways and it has usually been used to make a minute change in a frequency by adjusting a division factor of a phase locked loop. A multiple division factor divider can be implemented by creating a multiple division factor using a multi-phase of a voltage controlled oscillator or by combining a multiple number of dividers. Further, there has been used a method of changing an output frequency of the voltage controlled oscillator by directly modulating a control voltage of the voltage controlled oscillator.

However, the multiple division factor divider capable of adjusting the division factor of the phase locked loop needs a divider having a complicated configuration, and as a rate of an output clock increases, a timing margin decreases. Thus, it is limited to be implemented. Further, it is simple to directly modulate the control voltage of the voltage controlled oscillator as compared with the multiple division factor divider, but in order to do so, a large capacitor is needed and it occupies a large space.

With respect to a modulation profile generator as the most important component of the SSCG, it has been known that a Hershey-Kiss profile has the most effective profile waveform. However, generally, the Hershey-Kiss profile is implemented by using a memory and the memory occupies a large space and consumes a great amount of power, and, thus, it has not been used in most integration circuits.

Therefore, many designers have been used a triangular profile using a counter. The triangular profile has advantages of being efficient in view of a space and power consumption and easy to implement but has less effect of reducing electromagnetic interference than the Hershey-Kiss profile. Alternatively, it may be possible to use a piecewise linear modulation in which a triangular profile is divided by section and a linear inclination thereof is changed so as to be similar in waveform to the Hershey-Kiss profile. The piecewise linear modulation has more effect of reducing electromagnetic interference than the triangular profile but a profile needs to be divided into more minute sections so as to be similar to a non-linear profile such as a Hershey-Kiss profile. Therefore, a circuit becomes more complicated and an additional memory is needed to store an inclination in each section. Accordingly, the circuit needs more space and power.

The present disclosure provides a modulation profile generator capable of generating a modulation profile having a desirable form without using a memory and with less power and space.

Further, the present disclosure provides a frequency locked loop-based SSCG which is easier to implement and has more effect of reducing electromagnetic interference with less space than a conventional phase locked loop-based SSCG.

BRIEF SUMMARY OF THE INVENTION

In view of the foregoing, the present disclosure provides an improved effect of reducing electromagnetic interference.

In accordance with one aspect of the present disclosure, there is provided a modulation profile generator including an input signal generator that generates an input signal; a function calculator that outputs a function calculation result in the form of a square root graph by using the input signal as an input of a function; and a profile generator that generates a non-linear modulation profile based on the function calculation result.

Further, the profile generator may generate the non-linear modulation profile having a ½ frequency of a waveform generated as the function calculation result by symmetrically displacing odd-number periods or even-number periods of the waveform with respect to peak values of the waveform.

In accordance with another aspect of the present disclosure, there is provided a spread spectrum clock generator including an input signal generator that generates an input signal; a function calculator that outputs a function calculation result in the form of a square root graph by using the input signal as an input of a function; a profile generator that generates a non-linear modulation profile based on the function calculation result; and a clock generator that generates an output clock having a frequency modulated in a same manner as the non-linear modulation profile by using a modulation signal corresponding to the non-linear modulation profile.

Further, the clock generator may include a first frequency-voltage converter that generates a first voltage according to a frequency of a reference clock; a second frequency-voltage converter that generates a second voltage according to a frequency of a divided output clock and the modulation signal; a charge pump that generates a charging current according to the first voltage and a discharging current according to the second voltage; a loop filter that is charged and discharged by the charging current and the discharging current, respectively, and generates a control voltage; a voltage controlled oscillator that generates an output clock according to the control signal; and a divider that generates the divided output clock by dividing the output clock.

In accordance with still another aspect of the present disclosure, there is provided a modulation profile generating method includes generating an input signal having a predetermined frequency and waveform; outputting a function calculation result in the form of a square root graph by using the input signal as an input of a function; and generating a non-linear modulation profile based on the function calculation result.

Further, the non-linear modulation profile having a ½ frequency of a waveform generated as the function calculation result may be generated by symmetrically displacing odd-number periods or even-number periods of the waveform with respect to peak values of the waveform.

In accordance with the present disclosure, it is possible to generate a modulation profile similar to a desirable Hershey-Kiss profile by using a function for outputting a function calculation result in the form of a square root graph, and, thus, it is possible to effectively reduce electromagnetic interference.

Further, when a modulation profile generator is implemented, a simple function calculator is used without using a memory. Since a memory is not used, the modulation profile generator needs less space and power.

Furthermore, with a frequency locked loop using a frequency-voltage converter, it is possible to implement a SSCG with more simplicity and less space without a complicated fractional divider or a large capacitor.

DETAILED DESCRIPTION OF THE INVENTION

Figure 1:
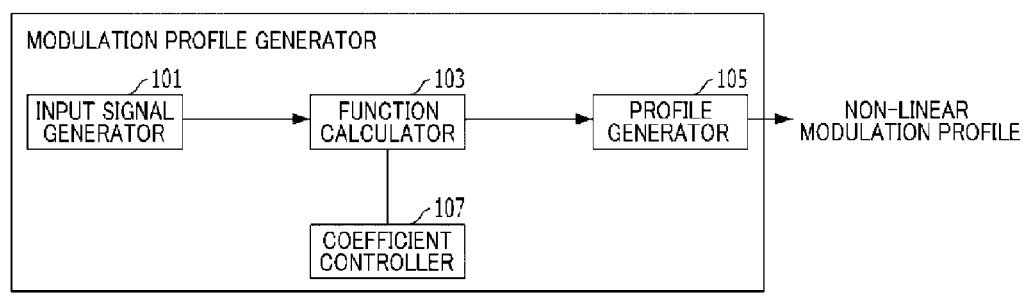
FIG. 1 is a configuration view of a modulation profile generator in accordance with the present disclosure.

Hereinafter, embodiments of the present invention will be described in detail with reference to the accompanying drawings so that the present invention may be readily implemented by those skilled in the art. However, it is to be noted that the present invention is not limited to the embodiments but can be realized in various other ways. In the drawings, parts irrelevant to the description are omitted for the simplicity of explanation, and like reference numerals denote like parts through the whole document.

FIG. 1 is a configuration view of a modulation profile generator in accordance with the present disclosure.

Referring to FIG. 1, a modulation profile generator of the present disclosure includes an input signal generator 101 that generates an input signal, a function calculator 103 that outputs a function calculation result in the form of a square root graph by using the input signal as an input of a function, and a profile generator 105 that generates a non-linear modulation profile based on the function calculation result. Further, the modulation profile generator may further include a coefficient controller 107. that determines a waveform of the non-linear modulation profile by controlling a coefficient of the function.

The input signal generator 101 may generate an input signal having a predetermined frequency and waveform. Generally, the input signal generator 101 is configured as a counter capable of increasing or decreasing numbers and may adjust a frequency of the input signal to a variable value by controlling a range of the increase or decrease. That is, the input signal generator 101 may adjust a frequency of the modulation profile by adjusting the frequency of the input signal to be higher or lower. Further, the input signal generator 101 may generate an input signal having a triangular waveform by increasing a value of the input signal by a predetermined number for a predetermined period of time and decreasing the value of the input signal by the same number for the next period of time.

The function calculator 103 performs a function calculation using the input signal as an input of a function such that a result of the function calculation forms a square root graph in order to generate a non-linear profile similar to a Hershey-Kiss profile. A multiplier and a divider may be needed to perform the function calculation. The divider may have a complicated physical configuration but can be simply implemented by synthesizing digital codes.

At the time of performing the function calculation, a Newton-Raphson's formula may be used to obtain the function calculation result in the form of a square root graph. The Newton-Raphson's formula is one of ways to obtain the square root of a number and can be expressed as follows.

$$y_{n+1} = \frac{1}{2}\left(y_n + \frac{x}{y_n}\right) \approx \sqrt{x} \qquad \text{[Formula 1]}$$

Based on the above formula 1, a graph of $y=\sqrt{x}$ can be obtained. However, if this formula is used as it is, iteration of $y_n$ and $y_{n+1}$ is needed. Such a calculation takes a long time and is inefficient. Therefore, as can be seen from the following approximate equation (formula 2), if a term $y_n$ is transposed by a first order equation $y_n=ax+b$, the iteration is not needed and it is possiblet to obtain a waveform similar to a waveform of $y=\sqrt{x}$.

$$\begin{aligned} y &= \frac{1}{2}\left(ax+b+\frac{x}{ax+b}\right) \\ &= \frac{a}{2}\left(x+\frac{b}{a}+\frac{(1/a^2)x}{x+\frac{b}{a}}\right) \\ &\approx \frac{3a}{2}\left(x+\frac{b}{a}+s\left[\frac{(1/a^2)x}{x+\frac{b}{a}}\right]\right) \end{aligned} \qquad \text{[Formula 2]}$$

The coefficient controller 107 may minutely control an inclination of a graph, a bending degree of a curve or the like by adjusting values of a, b, β, and s of the formula 2 and may determine a form of the modulation profile.

The profile generator 105 generates a non-linear modulation profile having the same form as the Hershey-Kiss profile by using a waveform obtained as the function calculation result of the function calculator 103. In order to do so, the profile generator 105 may symmetrically displace odd-number periods or even-number periods of the waveform generated as the function calculation result with respect to peak values thereof. The symmetrical displacement of the waveform is relatively easy to implement since only add and subtract operations are needed. The symmetrical displacement, referred as above, performs geometric transfer from an original curve to a transferred curve based on a reference line, so that the original curve and the transferred curve are symmetrically displaced with respect to the reference line. The symmetrical displacement will be described with reference to FIG. 2 as below.

Figure 2A:
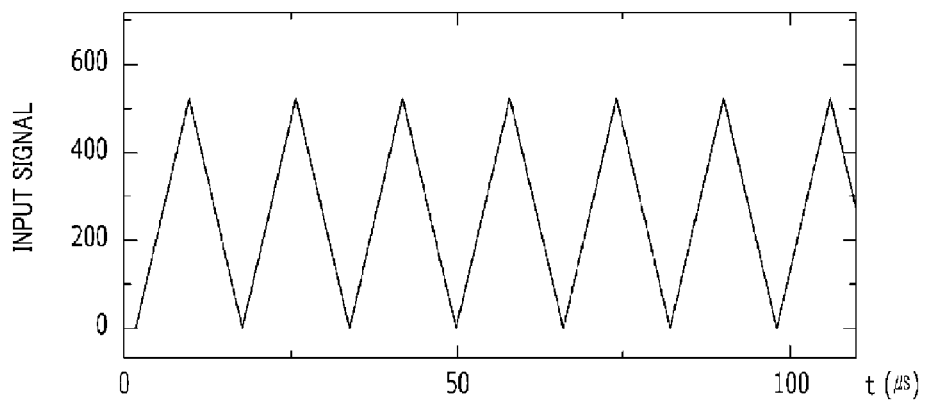
FIGS. 2A to 2C show graphs of a waveform generated in each block of the modulation profile generator of FIG. 1.
Figure 2B:
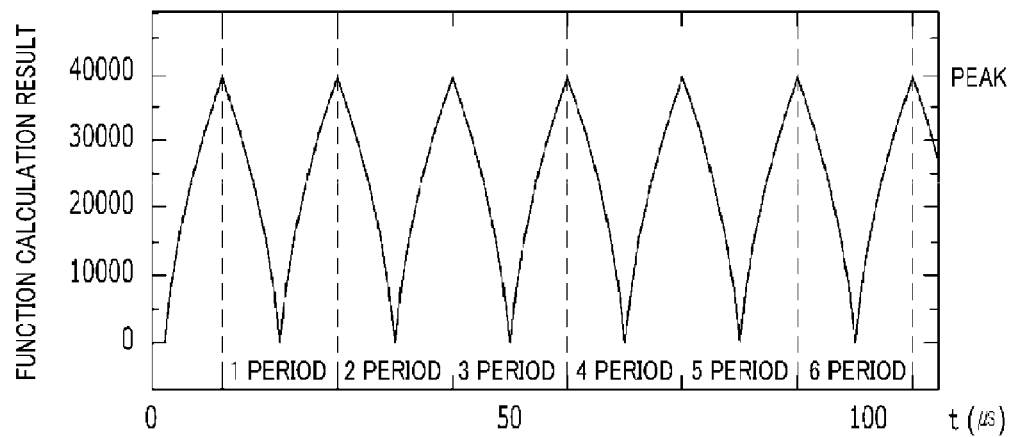
Figure 2C:
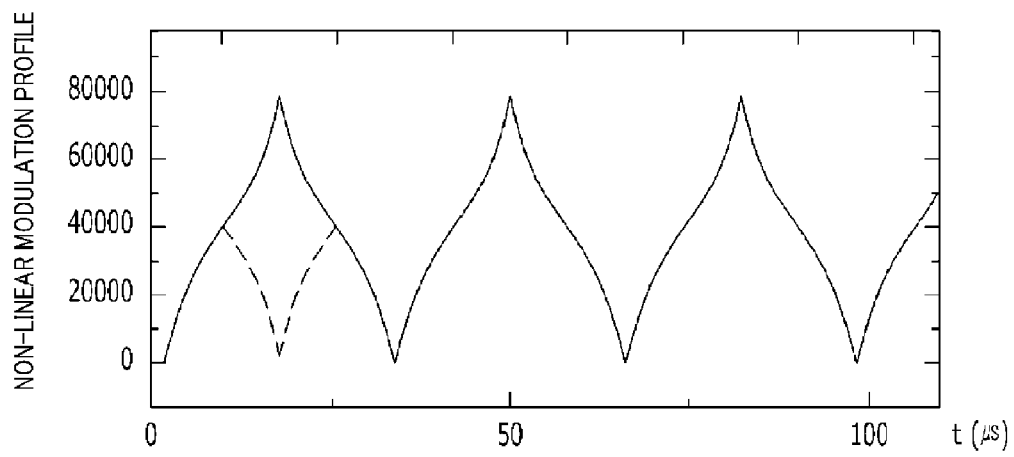

FIGS. 2A to 2C show graphs of a waveform generated in each block of the modulation profile generator of FIG. 1.

FIG. 2A shows an input signal of a triangular waveform generated by the input signal generator 101.

FIG. 2B shows a non-linear waveform obtained by function calculating using an input signal as an input of a function and an approximate equation derived from a Newton-Raphson's formula by the function calculator 103. Referring to FIG. 2B, it can be seen that a waveform of a square root graph is repeated on a period.

FIG. 2C shows a non-linear modulation profile finally generated by the profile generator 105. If odd-number periods or even-number periods of the waveform in FIG. 2B are symmetrically displaced with respect to peak values thereof, it is possible to obtain the non-linear modulation profile very similar to the Hershey-Kiss profile as shown in FIG. 2C. Here, a period of the final profile is double the period of the waveform (FIG. 2B) as the function calculation result, and, thus, a frequency decreases by ½.

Figure 3:
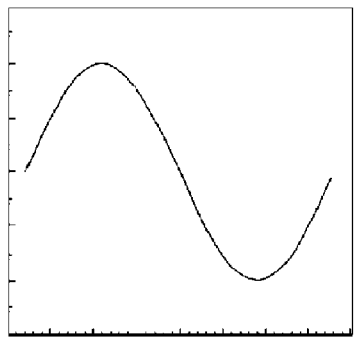
FIG. 3 shows frequency spectra according to three forms of modulation profiles.
Figure 3:
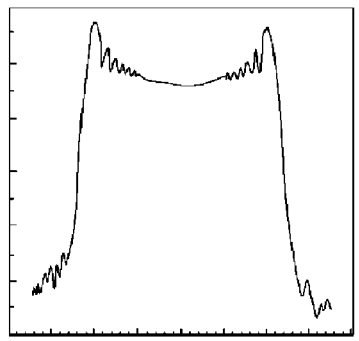
Figure 3:
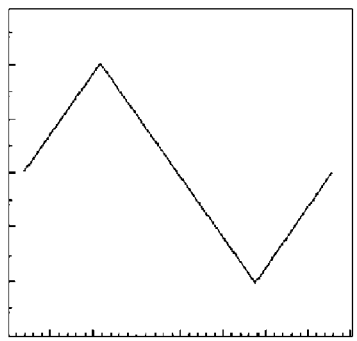
Figure 3:
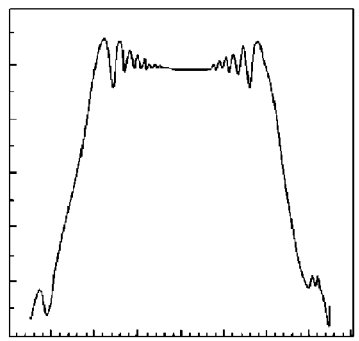
Figure 3:
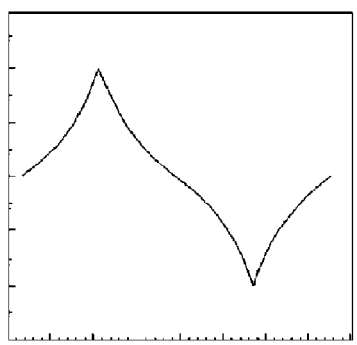
Figure 3:
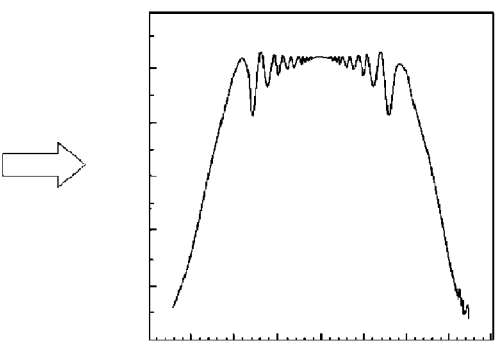

FIG. 3 shows frequency spectra according to three forms of modulation profiles.

Referring to FIG. 3, it can be seen that as compared with a spectrum (d) according to a profile (c) of a general triangular waveform, a spectrum (f) according to a non-linear profile (e) of the present disclosure is uniformly distributed at lower power levels. Accordingly, by using the modulation profile generator in accordance with the present disclosure, an effect of reducing electromagnetic interference can be further improved.

Figure 4:
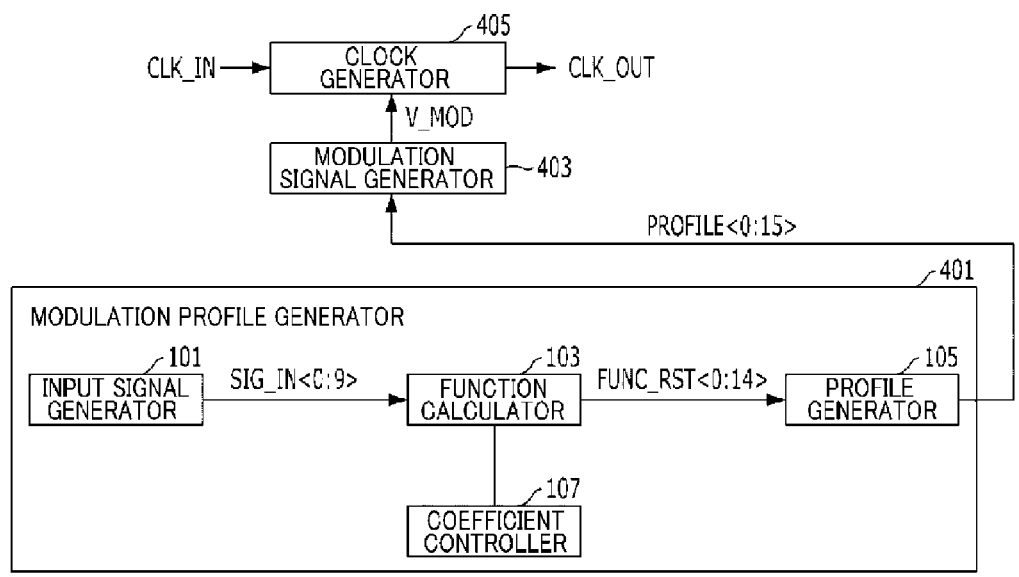
FIG. 4 is a configuration view of a spread spectrum clock generator (SSCG) including a modulation profile generator in accordance with the present disclosure.

FIG. 4 is a configuration view of a spread spectrum clock generator (SSCG) including a modulation profile generator in accordance with the present disclosure.

Referring to FIG. 4, a spread spectrum clock generator (SSCG) in accordance with an embodiment of the present disclosure includes a modulation profile generator 401 including the input signal generator 101, the function calculator 103 that outputs a function calculation result (FUNC_RST<0:14>) in the form of a square root graph by using an input signal (SIG_IN<0:9>) as an input of a function, and the profile generator 105 that generates a non-linear modulation profile (PROFILE<0:15>) based on the function calculation result (FUNC_RST<0:14>), a modulation signal generator 403 that generates a modulation signal corresponding to the non-linear modulation profile (PROFILE<0:15>), and a clock generator 405 that generates an output clock (CLK_OUT) having a frequency modulated in the same manner as the non-linear modulation profile (PROFILE<0:15>) by using the modulation signal.

In the modulation profile generator 401, as described with reference to FIGS. 1 to 2C, the input signal generator 101 generates the input signal (SIG_IN<0:9>) having a predetermined frequency and form, particularly, for example a triangular waveform. Further, the function calculator 103 performs a function calculation using the input signal (SIG_IN<0:9>) based on the Newton-Raphson's formula and generates a waveform of a square root graph. Furthermore, the profile generator 105 generates the non-linear modulation profile (PROFILE<0:15>) having the same form as the Hershey-Kiss profile by symmetrically displacing odd-number periods or even-number periods of the waveform with respect to peak values thereof. Moreover, the modulation profile generator 401 may further include the coefficient controller 107 that minutely determines a waveform of the non-linear modulation profile by controlling a coefficient of the function.

Here, the input signal (SIG_IN<0:9>) may be a 10-bit digital signal, the function calculation result (FUNC_RST<0:14>) of the function calculator 103 may be a 15-bit digital signal, and the non-linear modulation profile (PROFILE<0:15>) finally generated by the profile generator 105 may be a 16-bit digital signal.

Further, the input signal generator 101 may receive a 2-bit control signal <0:1> (not illustrated in the drawing) and determine a frequency of the non-linear modulation profile. By way of example, the frequency of the non-linear modulation profile may be set to 33 kHz when an input value of the control signal <0:1> is 1, 66 kHz when the input value is 1, and 99 kHz when the input value is 3. In this way, the input signal generator 101 may control the non-linear modulation profile (PROFILE<0:15>) to have various frequencies using the control signal <0:1>.

Figure 5:
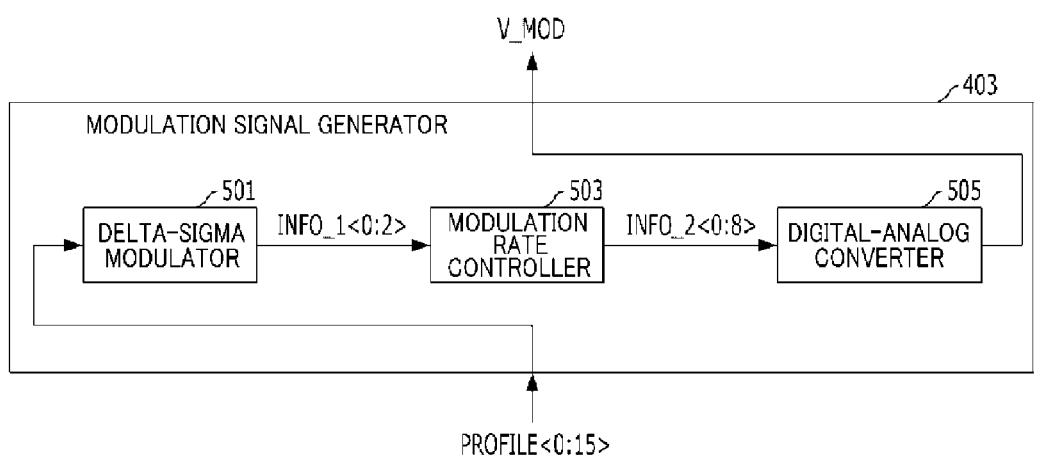
FIG. 5 is a configuration view of a modulation signal generator 403 of FIG. 4.

FIG. 5 is a configuration view of a modulation signal generator 403 of FIG. 4.

In the SSCG of FIG. 4, the modulation profile generator 401 is configured to generate and output digital signals, whereas the clock generator 405 is configured to receive analog signals. Therefore, the modulation signal generator 403 converts digital signals, such as the non-linear modulation profile (PROFILE<0:15>) to analog signals, such as the modulation signal (V_MOD).

Referring to FIG. 5, the modulation signal generator 403 includes a delta-sigma modulator 501 that delta-sigma converts the non-linear modulation profile (PROFILE<0:15>) and generates a first processed information (INFO_1<0:2>), a modulation rate controller 503 that receives the first processed information (INFO_1<0:2>), controls a frequency modulation rate and generates a second processed information (INFO_2<0:8>), and a digital-analog converter 505 that digital-analog converts the second processed information (INFO_2<0:8>) and generates the modulation signal (V_MOD).

The delta-sigma modulator 501 has a kind of sampling function. In the SSCG in accordance with the present disclosure, a 3rd order delta-sigma modulator may be used. A SSCG using a phase locked loop needs a divider having eight fractional division factors. However, it is very difficult to design the divider having eight fractional division factors, and, thus, generally, a 1st order delta-sigma modulator is used in the SSCG using the phase locked loop. However, the 1st order delta-sigma modulator does not give high performance in restoring a profile in a low pass filter (hereinafter, referred to as "LPF"), which may decrease the effect of reducing electromagnetic interference. Meanwhile, the SSCG in accordance with the present disclosure uses the clock generator 405 using a frequency locked loop (to be described with reference to FIGS. 6 to 9), and, thus, it becomes easy to implement the 3rd order delta-sigma modulator producing high profile resolution. The frequency locked loop-based SSCG simply decodes an output signal of the 3rd order delta-sigma modulator and directly transmits it to the digital-analog converter 505.

The modulation rate controller 503 may receive a 3-bit control signal <0:2> (not illustrated in the drawing) and controls the frequency modulation rate in a range of from about 0% to about 3.5%. That is, if the control signal <0:2> has an integer input value ranging from 0 to 7, the modulation rate controller 503 may control the frequency modulation rate in the range of from about 0% to about 3.5% by about 0.5% point difference with respect to each input value. Further, the modulation rate controller 503 may control an input signal of the digital-analog converter for measuring a reference frequency, so that up-spreading and down-spreading are facilitated. By way of example, a frequency of the input clock (CLK_IN) is about 100 MHz and the frequency modulation rate is about 1%, an output clock (CLK_OUT) has a modulated frequency in a range of from about 99 MHz to about 100 MHz by down spreading and a modulated frequency in a range of from about 100 MHz to about 101 MHz by up spreading.

The digital-analog converter 505 generates the modulation signal (V_MOD) by digital-analog converting the second processed information (INFO_2<0:8>) generated by the modulation rate controller 503 and then transmits it to the clock generator 405. The digital-analog converter 505 may control the frequency modulation rate by about 0.5% point difference by using a total of about 200 standard current cells. The modulation signal (V_MOD) generated by the digital-analog converter 505 may have an analog voltage value.

Herein, the first processed information (INFO_1<0:2>) may be a 3-bit digital signal and the second processed information (INFO_2<0:8>) may be a 9-bit digital signal.

Figure 6:
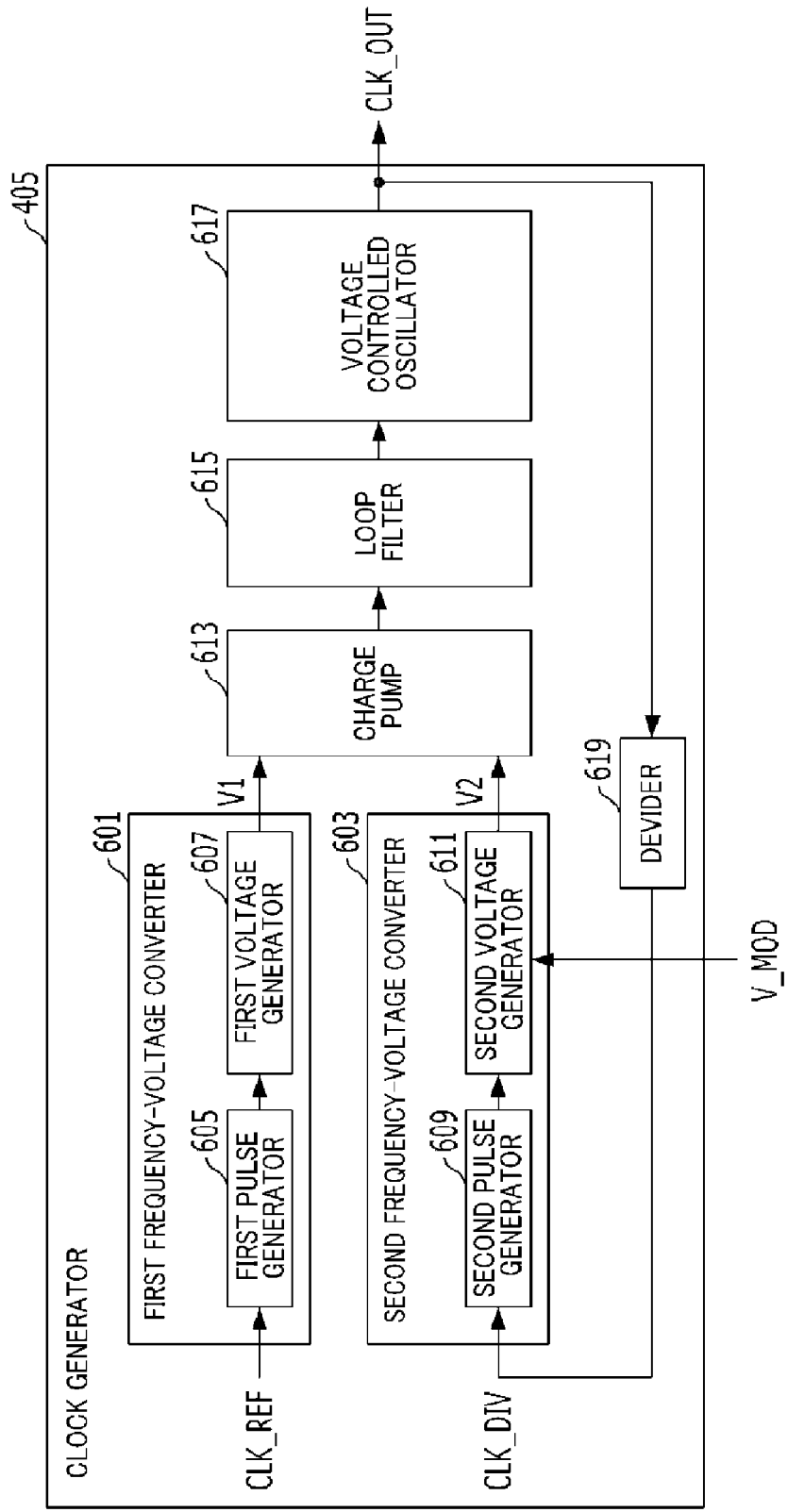
FIG. 6 is a configuration view of a clock generator 405 of FIG. 4.

FIG. 6 is a configuration view of a clock generator 405 of FIG. 4.

A clock generator of the SSCG may be formed of a phase locked loop or a frequency locked loop. FIG. 6 shows an embodiment of the clock generator 405 formed of the frequency locked loop which is easier to implement and has more effect of reducing electromagnetic interference with less space than the phase locked loop.

Referring to FIG. 6, the clock generator 405 includes a first frequency-voltage converter 601 that generates a first voltage (V1) according to a frequency of a reference clock (CLK_REF), a second frequency-voltage converter 603 that generates a second voltage (V2) according to a frequency of a divided output clock (CLK_DIV) and the modulation signal (V_MOD), a charge pump 613 that generates a charging current according to the first voltage (V1) and a discharging current according to the second voltage (V2), a loop filter 615 that is charged and discharged by the charging current and the discharging current, respectively, and generates a control voltage, a voltage controlled oscillator 617 that generates an output clock (CLK_OUT) according to the control signal, and a divider 619 that generates the divided output clock (CLK_DIV) by dividing the output clock (CLK_OUT).

Herein, the reference clock (CLK_REF) may be an input clock (CLK_IN) to be inputted directly to the SSCG or a clock divided from the input clock (CLK_IN) at a predetermined division rate.

In the present embodiment, the first frequency-voltage converter 601 includes a first pulse generator 605 and a first voltage generator 607, and the second frequency-voltage converter 603 includes a second pulse generator 609 and a second voltage generator 611.

The first pulse generator 605 and the second pulse generator 609 generate one or more control pulses corresponding to a frequency of the reference clock (CLK_REF) and a frequency of the divided output clock (CLK_DIV), respectively. The first pulse generator 605 and the second pulse generator 609 control several switches within the first voltage generator 607 and the second voltage generator 611 by using the control pulses so as to allow the first voltage generator 607 and the second voltage generator 611 to generate the first voltage (V1) and the second voltage (V2), respectively. This will be explained with reference to FIGS. 7 to 9.

The first frequency-voltage converter 601 may receive the reference clock (CLK_REF) of a fixed frequency, and the outputted first voltage (V1) may have a fixed value corresponding to the reference clock (CLK_REF). Meanwhile, the second frequency-voltage converter 603 may receive the modulation signal (V_MOD) varying depending on a form of the non-linear modulation profile (PROFILE<0:15>), and, thus, the outputted second voltage (V2) may have various frequencies and forms.

The charge pump 613 may generates the charging current corresponding to an amount of the first voltage (V1) and the discharging current corresponding to an amount of the second voltage (V2) and transmits them to the loop filter 615. The loop filter 615 generates the control voltage with the charging current and discharging current generated by the charge pump 613, and the voltage controlled oscillator 617 generates the output clock (CLK_OUT) of a frequency corresponding to the control voltage. The output clock (CLK_OUT) is outputted to the outside of the clock generator 405 and divided by the divider 619 to be inputted to the second frequency-voltage converter 603 at the same time.

By the above-described process, the output clock (CLK_OUT) may have a modulated frequency in the same manner as the non-linear modulation profile (PROFILE<0:15>) generated by the modulation profile generator 401.

Figure 7:
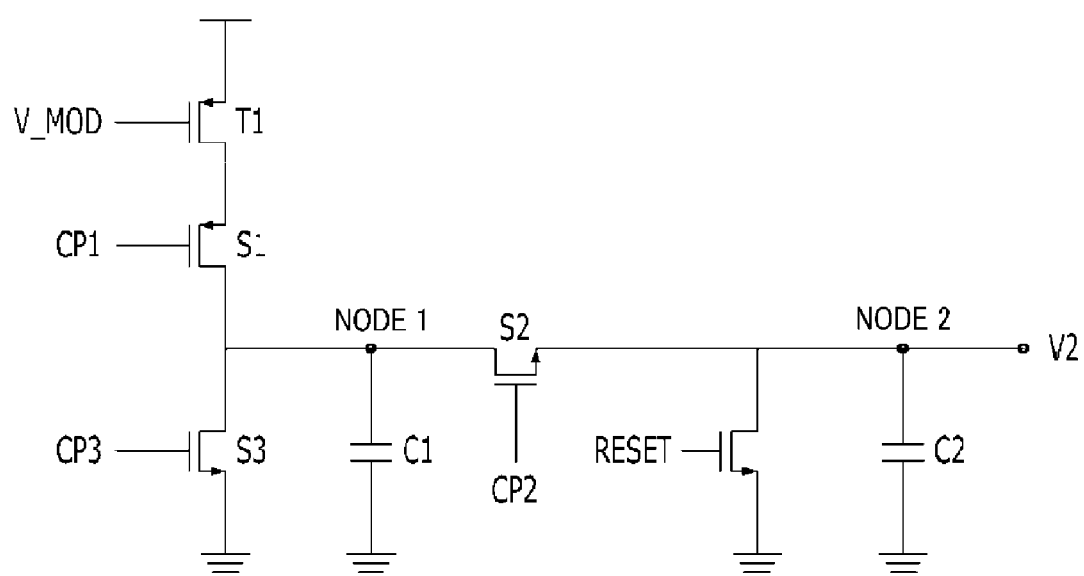
FIG. 7 is a circuit diagram of a frequency-voltage converter.
Figure 8A:
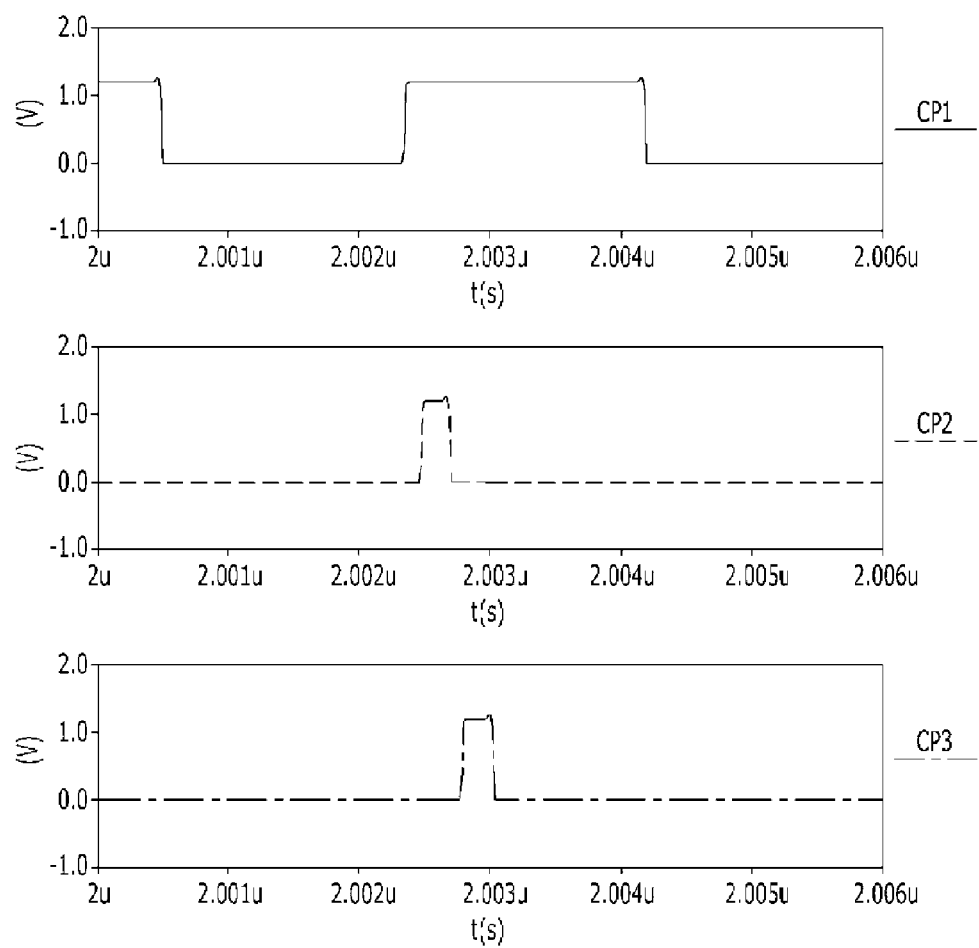
FIG. 8A is a graph showing waveforms of control pulses generated by a pulse generator.
Figure 8B:
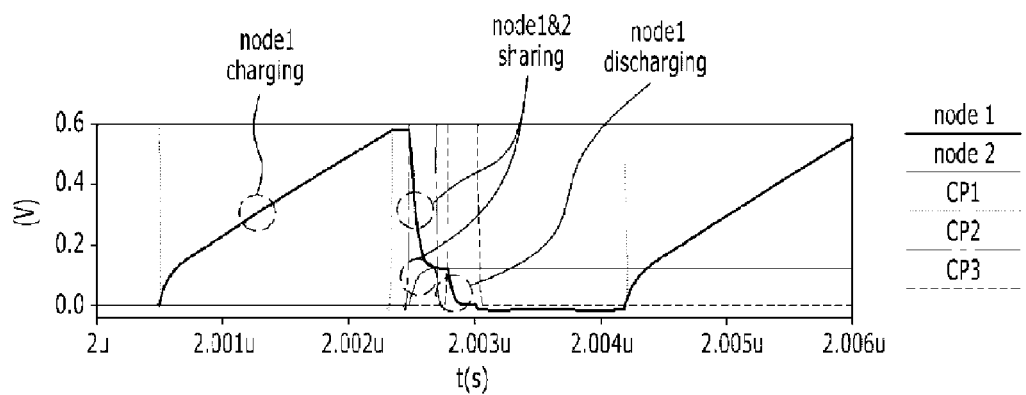
FIG. 8B is a graph showing a voltage change at each node of a frequency-voltage converter depending on a control pulse.
Figure 9:
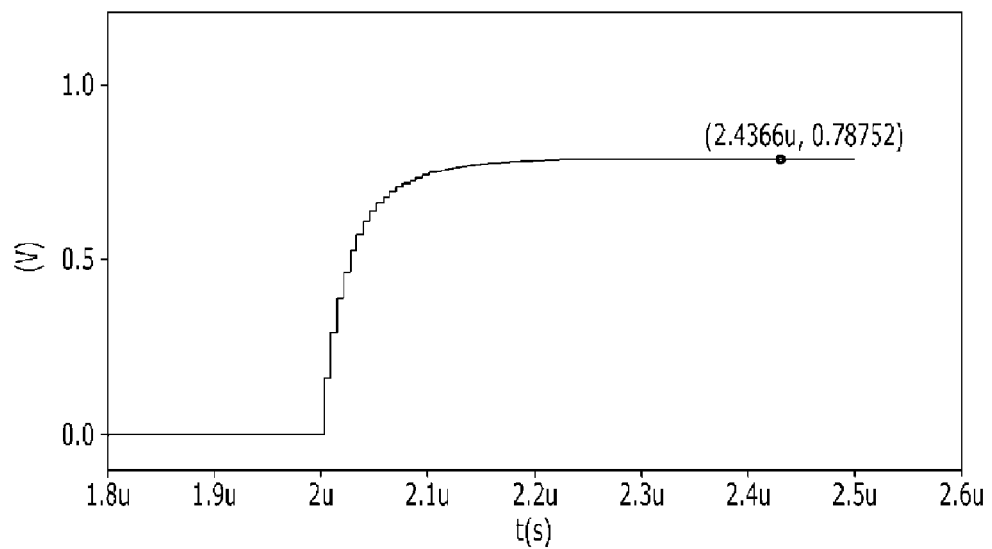
FIG. 9 is a graph showing a procedure in which a voltage at a node 2 of a frequency-voltage convertor of FIG. 7 converges on a final value.

FIG. 7 is a circuit diagram of a second voltage generator 611. FIG. 8A is a graph showing waveforms of control pulses 1, 2 and 3 (CP1, CP2 and CP3) generated by the second pulse generator 609 and FIG. 8B is a graph showing a voltage change at each node of the second voltage generator 611 depending on the control pulses 1, 2 and 3 (CP1, CP2 and CP3). FIG. 9 is a graph showing a procedure in which a voltage at a node 2 of the second voltage generator 611 converges on a final value.

Referring to FIG. 7, a transistor T1 serves as a current source to determine an amount of an input current to be supplied to a circuit according to a modulation signal (V_MOD). All transistors S1, S2, S3 and S4 serve as switches to charge and discharge capacitors C1 and C2.

The control pulses 1, 2 and 3 (CP1, CP2 and CP3) of FIG. 8A control the transistors S1, S2, and S3 of FIG. 7, respectively. A frequency of each control pulse corresponds to a frequency of a divided output clock (CLK_DIV) to be inputted to the second pulse generator 609, and in the present embodiment, the frequency of the control pulse is designed to have a ½ frequency of the divided output clock (CLK_DIV).

When the control pulse 1 (CP1) is low, the transistor S1 is ON state and the capacitor C1 is charged with electric charges. In FIG. 8B, a voltage at a node 1 is on the increase. When the control pulse 1 (CP1) is high, the transistor S1 is OFF state and breaks a current through the S1 and the capacitor C1 keeps the charged electric charges and the voltage at the node 1 is constantly maintained. At this time, the control pulses 2 and 3 (CP2 and CP3) are low.

When the control pulse 2 (CP2) is high, the transistor S2 is ON state and the electric charges of the capacitor C1 is distributed to the capacitor C2. At this time, the voltage at the node 1 becomes decreased and a voltage at a node 2 becomes increased to be equal to the voltage at the node 1. When the control pulse 2 (CP2) is low, the transistor S2 is OFF state and the voltages at the nodes 1 and 2 are maintained as being equal to each other.

When the control pulse 3 (CP3) is high, the transistor S3 is ON state and the electric charges remaining in the capacitor C1 moves off the capacitor C1 and the voltage at the node 1 is reset to an initial value 0[V]. The electric charges of the capacitor C2 are kept therein, and, thus, the voltage at the node 2 is maintained.

Such a process is repeated until an amount of the electric charges to be charged in the capacitor C2 becomes equal to the maximum amount of the electric charges to be charged in the capacitor C1, i.e., until the voltage at the node 2 becomes equal to the maximum voltage at the node 1. In this way, the voltage at the node 2 gradually increases as depicted in FIG. 9 and converges on a final value. This final value becomes the second voltage (V2) as an output voltage of the second frequency-voltage converter 603.

If a frequency of a clock is high, a period of control pulses becomes short, particularly, a time for the control pulse 1 (CP1) to be low becomes short. Therefore, the amount of the electric charges to be charged in the capacitor C1 becomes decreased and the maximum voltage at the node 1 becomes low, and the final value of the voltage at the node 2 becomes low accordingly. On the contrary, if a frequency of a clock is low, a time for the control pulse (CP1) to be low becomes long and the maximum voltage at the node 1 and the final value of the voltage at the node 2 become high. That is, if a frequency of the divided output clock (CLK_DIV) is high, the second voltage (V2) becomes low, and if a frequency of the divided output clock (CLK_DIV) is low, the second voltage (V2) becomes high.

Since the modulation signal (V_MOD) controls an amount of the input current of the transistor T1, if a value of the modulation signal (V_MOD) is high, the amount of the input current becomes increased and the voltage at the node 1 becomes increased more rapidly and if a value of the modulation signal (V_MOD) is low, the volume of the input current becomes decreased and the voltage at the node 1 becomes increased more slowly. That is, the modulation signal (V_MOD) may control the maximum voltage at the node 1 and the final value of the voltage at the node 2 by changing an inclination of a section where the voltage at the node 1 is on the increase in FIG. 8B.

The first frequency-voltage converter 603 can be designed to be identical with the second frequency-voltage converter 601. Therefore, the above explanation with reference to FIGS. 7 to 9 can be applied the first frequency-voltage converter 603. However, in case of the first voltage generator 607, the modulation signal (V_MOD) to be inputted to the transistor T1 in FIG. 7 may have a fixed value. In this case, an amount of the input current may be constantly maintained and an amount of the first voltage (V1) may be determined by only a frequency of the reference clock (CLK_REF).

As described above, the present disclosure provides a modulation profile generator that generates a modulation profile having a desirable form similar to a Hershey-Kiss profile by using a simple function calculator that outputs a function calculation result in the form of a square root graph, and, thus, it is possible to maximize an effect of reducing electromagnetic interference. Further, the present disclosure suggests a frequency locked loop-based SSCG using a frequency-voltage converter instead of a phase locked loop-based one, and, thus, it is possible to implement the SSCG with more simplicity and less space and the SSCG is highly effective in reducing electromagnetic interference.

The above description of the present invention is provided for the purpose of illustration, and it would be understood by those skilled in the art that various changes and modifications may be made without changing technical conception and essential features of the present invention. Thus, it is clear that the above-described embodiments are illustrative in all aspects and do not limit the present invention.

The scope of the present invention is defined by the following claims rather than by the detailed description of the embodiment. It shall be understood that all modifications and embodiments conceived from the meaning and scope of the claims and their equivalents are included in the scope of the present invention.

What is claimed is:

1. A modulation profile generator comprising:
an input signal generator capable of generating an input signal;
a function calculator capable of outputting a function calculation result in the form of a square root graph by using the input signal as an input of a function; and
a profile generator capable of generating a non-linear modulation profile based on the function calculation result.

2. The modulation profile generator of claim 1, wherein the input signal generator generates the input signal having a predetermined frequency and waveform.

3. The modulation profile generator of claim 2, wherein the profile generator generates the non-linear modulation profile having a ½ frequency of a waveform generated as the function calculation result by symmetrically displacing odd-number periods or even-number periods of the waveform with respect to peak values of the waveform.

4. The modulation profile generator of claim 1, wherein the function uses an approximate equation derived from a Newton-Raphson's formula.

5. The modulation profile generator of claim 2, wherein the predetermined frequency is adjusted to a variable value and the predetermined waveform is a triangular waveform.

6. The modulation profile generator of claim 1, further comprising:
a coefficient controller capable of determining a waveform of the non-linear modulation profile by controlling a coefficient of the function.

7. A spread spectrum clock generator comprising:
an input signal generator capable of generating an input signal;
a function calculator capable of outputting a function calculation result in the form of a square root graph by using the input signal as an input of a function;
a profile generator capable of generating a non-linear modulation profile based on the function calculation result; and
a clock generator capable of generating an output clock having a frequency modulated in a same manner as the non-linear modulation profile by using a modulation signal corresponding to the non-linear modulation profile.

8. The spread spectrum clock generator of claim 7, wherein the input signal generator generates the input signal having a predetermined frequency and waveform.

9. The spread spectrum clock generator of claim 8, wherein the profile generator generates the non-linear modulation profile having a ½ frequency of a waveform generated as the function calculation result by symmetrically displacing odd-number periods or even-number periods of the waveform with respect to peak values of the waveform.

10. The spread spectrum clock generator of claim 7, wherein the function uses an approximate equation derived from a Newton-Raphson's formula.

11. The spread spectrum clock generator of claim 8, wherein the predetermined frequency is adjusted to a variable value and the predetermined waveform is a triangular waveform.

12. The spread spectrum clock generator of claim 7, further comprising:
a coefficient controller capable of determining a waveform of the non-linear modulation profile by controlling a coefficient of the function.

13. The spread spectrum clock generator of claim 7, further comprising:
a delta-sigma modulator capable of generating a first processed information by delta-sigma converting the non-linear modulation profile generated by the profile generator;
a modulation rate controller capable of receiving the first processed information and generating a second processed information by controlling a frequency modulation rate; and
a digital-analog converter capable of generating the modulation signal by digital-analog converting the second processed information.

14. The spread spectrum clock generator of claim 13, wherein the delta-sigma modulator is a 3rd order delta-sigma modulator.

15. The spread spectrum clock generator of claim 13, wherein the modulation rate controller controls the frequency modulation rate in a range of from about 0% to about 3.5% by about 0.5% point difference.

16. The spread spectrum clock generator of claim 7, wherein the clock generator includes:
a first frequency-voltage converter capable of generating a first voltage according to a frequency of a reference clock;
a second frequency-voltage converter capable of generating a second voltage according to a frequency of a divided output clock and the modulation signal;
a charge pump capable of generating a charging current according to the first voltage and a discharging current according to the second voltage;
a loop filter capable of being charged and discharged by the charging current and the discharging current, respectively, and generating a control voltage;
a voltage controlled oscillator capable of generating an output clock according to the control signal; and
a divider capable of generating the divided output clock by dividing the output clock.

17. A modulation profile generating method comprising:
generating an input signal having a predetermined frequency and waveform;
outputting a function calculation result in the form of a square root graph by using the input signal as an input of a function; and
generating a non-linear modulation profile based on the function calculation result.

18. The modulation profile generating method of claim 17, wherein in the process of generating the non-linear modulation profile, the non-linear modulation profile having a ½ frequency of a waveform generated as the function calculation result is generated by symmetrically displacing odd-number periods or even-number periods of the waveform with respect to peak values of the waveform.

19. The modulation profile generating method of claim 17, wherein the function uses an approximate equation derived from a Newton-Raphson's formula.

* * * * *

UNITED STATES PATENT AND TRADEMARK OFFICE
CERTIFICATE OF CORRECTION

PATENT NO. : 8,319,537 B2  
APPLICATION NO. : 13/034002  
DATED : November 27, 2012  
INVENTOR(S) : Chul Woo Kim et al.

Page 1 of 1

It is certified that error appears in the above-identified patent and that said Letters Patent is hereby corrected as shown below:

In the Specification; column 3 line 63, please delete "." after the "107".

In the Specification; column 9 line 15, please add the -- 1 -- after the word "pulse".

Signed and Sealed this  
Twenty-first Day of May, 2013

Teresa Stanek Rea  
*Acting Director of the United States Patent and Trademark Office*